(12) United States Patent
Oota et al.

(10) Patent No.: US 10,566,464 B2
(45) Date of Patent: Feb. 18, 2020

(54) SEMICONDUCTOR DEVICE

(71) Applicant: KABUSHIKI KAISHA TOSHIBA, Tokyo (JP)

(72) Inventors: Tsuyoshi Oota, Ibo Hyogo (JP); Yoichi Hori, Himeji Hyogo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 82 days.

(21) Appl. No.: 15/243,525

(22) Filed: Aug. 22, 2016

(65) Prior Publication Data

US 2017/0271528 A1 Sep. 21, 2017

(30) Foreign Application Priority Data

Mar. 16, 2016 (JP) ................. 2016-053102

(51) Int. Cl.
*H01L 29/06* (2006.01)
*H01L 29/872* (2006.01)
(Continued)

(52) U.S. Cl.
CPC ........ *H01L 29/872* (2013.01); *H01L 27/0814* (2013.01); *H01L 29/0615* (2013.01);
(Continued)

(58) Field of Classification Search
CPC ............... H01L 29/063; H01L 29/7813; H01L 29/0696; H01L 29/1608; H01L 29/1095;
(Continued)

(56) References Cited

U.S. PATENT DOCUMENTS 8,633,560 B2  1/2014 Aketa
8,866,151 B2  10/2014 Noda et al.
(Continued)

FOREIGN PATENT DOCUMENTS

JP  2000252478 A  9/2000
JP  3169604 B2  5/2001
(Continued)

*Primary Examiner* — Moin M Rahman
(74) *Attorney, Agent, or Firm* — Kim & Stewart LLP

(57) ABSTRACT

A semiconductor device includes a semiconductor layer located between first and second electrodes. The contact location of the semiconductor layer with the first electrode forms a first contact plane. The semiconductor layer includes a first-conductivity-type first semiconductor region in contact with the first electrode, a second-conductivity-type second semiconductor region located between the first electrode and the first semiconductor region and contacting the first electrode, a second-conductivity-type third semiconductor region located between the first electrode and the second semiconductor region and contacting the first electrode and having a higher impurity concentration than that of the second semiconductor region, and a second-conductivity-type fourth semiconductor region located between the first electrode and the first semiconductor region and contacting the first electrode. The fourth semiconductor region is narrower than the second semiconductor region, shallower than the second semiconductor region, and has a lower impurity concentration than that of the third semiconductor region.

16 Claims, 12 Drawing Sheets

(51) Int. Cl.
  *H01L 27/08* (2006.01)
  *H01L 29/16* (2006.01)
  *H01L 29/36* (2006.01)
  *H01L 29/868* (2006.01)

(52) U.S. Cl.
  CPC .......... *H01L 29/1608* (2013.01); *H01L 29/36* (2013.01); *H01L 29/868* (2013.01)

(58) Field of Classification Search
  CPC ........... H01L 29/4236; H01L 29/66704; H01L 29/66734; H01L 29/7397; H01L 29/7825
  USPC .......... 257/20, 194, 135–136, 213–413, 900, 257/902–903
  See application file for complete search history.

(56) References Cited

U.S. PATENT DOCUMENTS

| | | |
|---|---|---|
| 9,142,687 B2 | 9/2015 | Hori et al. |
| 2010/0096692 A1* | 4/2010 | Saito ................... H01L 29/0634 257/330 |
| 2011/0175106 A1* | 7/2011 | Mizukami ........... H01L 29/0692 257/77 |
| 2012/0267748 A1 | 10/2012 | Suzuki |
| 2014/0231867 A1* | 8/2014 | Yamashita ............ H01L 29/872 257/140 |
| 2014/0353683 A1* | 12/2014 | Ishimabushi ....... H01L 29/1608 257/77 |
| 2015/0035111 A1 | 2/2015 | Ota et al. |

FOREIGN PATENT DOCUMENTS

| | | |
|---|---|---|
| JP | 2002314099 A | 10/2002 |
| JP | 2009105200 A | 5/2009 |
| JP | 2011233614 A | 11/2011 |
| JP | 2012204411 A | 10/2012 |
| JP | 2012227429 A | 11/2012 |
| JP | 2012227501 A | 11/2012 |
| JP | 5428435 B2 | 2/2014 |
| JP | 2015029046 A | 2/2015 |
| JP | 2015032627 A | 2/2015 |

\* cited by examiner

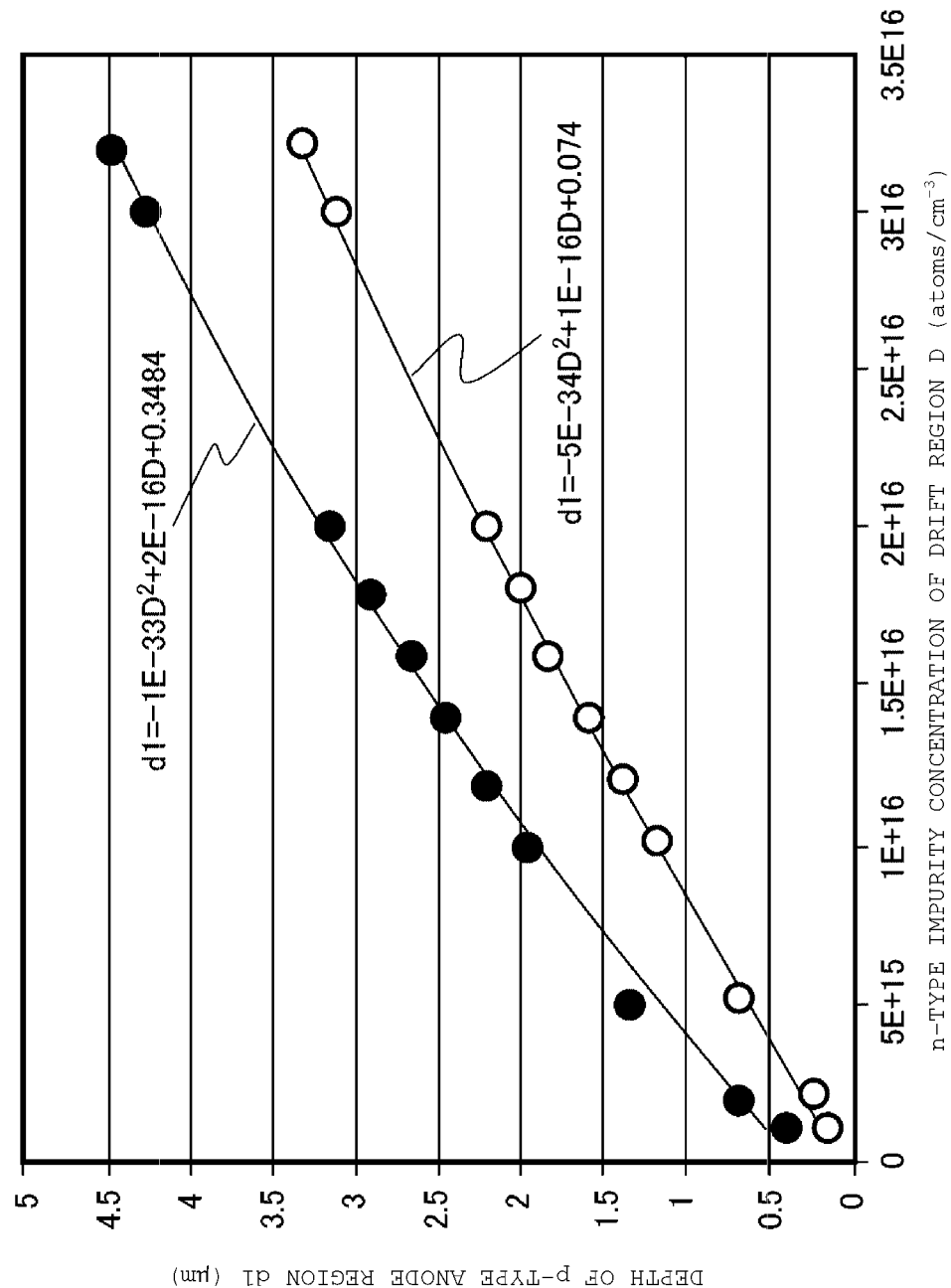

SEMICONDUCTOR DEVICE

CROSS-REFERENCE TO RELATED APPLICATION

This application is based upon and claims the benefit of priority from Japanese Patent Application No. 2016-053102, filed Mar. 16, 2016, the entire contents of which are incorporated herein by reference.

FIELD

Embodiments described herein relate generally to a semiconductor device.

BACKGROUND

Generally, in a Schottky barrier diode (SBD), and a junction barrier Schottky diode (JBS) which is a kind of SBD, a PIN diode region may be provided in an element region so as to improve forward surge resistance. The JBS provided with the PIN diode region is referred to as a merged PIN-diode Schottky-diode (MPS).

When the PIN diode region is provided in the element region, it is possible for a large forward surge current to flow by using conductivity modulation of the PIN diode region. When the area occupied by the PIN diode region in the element region is increased, the area occupied by a Schottky region, which allows the on-state current to flow during a typical operation, is decreased. Thus, there is a problem that an on-state current per unit area (on-state current density) during a typical operation decreases.

DESCRIPTION OF THE DRAWINGS

FIG. 6 is an explanatory view of the operation and effect of the semiconductor device according to the first embodiment.

DETAILED DESCRIPTION

Figure 1:
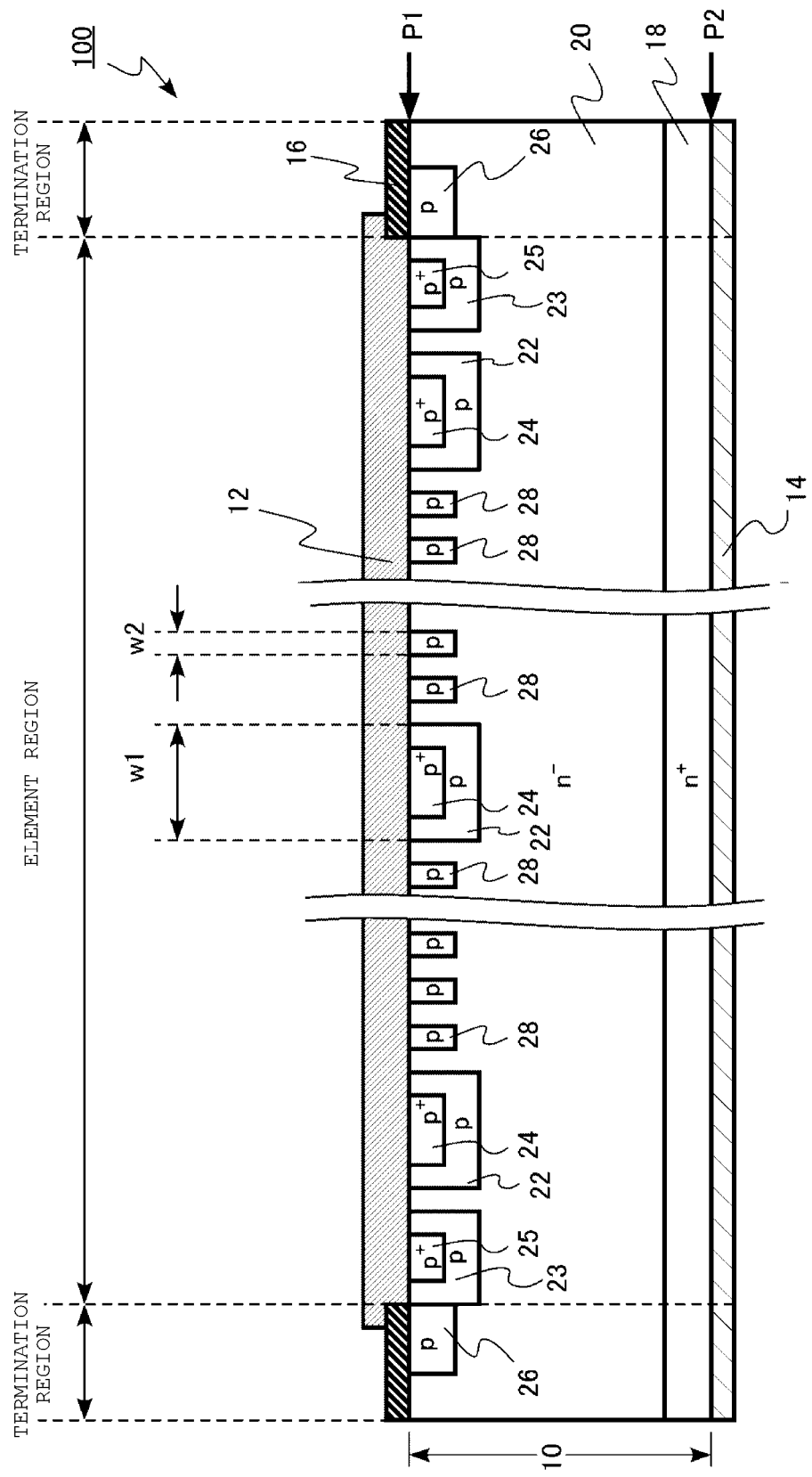
FIG. 1 is a schematic cross-sectional view of a semiconductor device according to a first embodiment.

According to an embodiment, there is provided a semiconductor device capable of achieving an increase in an on-state current density.

In general, according to one embodiment, there is provided a semiconductor device including a first electrode, a second electrode and a semiconductor layer at least a portion of which is provided between the first electrode and the second electrode. The contact location of the semiconductor layer with the first electrode forms a first contact plane. The semiconductor layer includes a first-conductivity-type first semiconductor region in contact with the first electrode, a second-conductivity-type second semiconductor region located between the first electrode and the first semiconductor region and in contact with the first electrode, a second-conductivity-type third semiconductor region located between the first electrode and the second semiconductor region and in contact with the first electrode and having a second-conductivity-type impurity concentration higher than a second-conductivity-type impurity concentration of the second semiconductor region, and a second-conductivity-type fourth semiconductor region located between the first electrode and the first semiconductor region and in contact with the first electrode. The fourth semiconductor region has a width narrower than a width of the second semiconductor region and a depth inwardly of the semiconductor layer from the first contact plane shallower than depth of the second semiconductor region inwardly of the first contact plane. The fourth semiconductor region has a second-conductivity-type impurity concentration lower than a second-conductivity-type impurity concentration of the third semiconductor region.

Hereinafter, embodiments will be described with reference to the accompanying drawings. Furthermore, in the following description, the same reference numeral will be given to the same members and the like, and description thereof will be appropriately omitted.

In addition, in the following description, notations of "n$^+$", "n", "n$^-$", "p$^+$", "p" and "p$^-$" represent relative magnitudes of impurity concentrations of respective conductivity types. That is, "n$^+$" represents an n-type impurity concentration that is relatively higher in comparison to "n", and "n$^-$" represents an n-type impurity concentration that is relatively lower in comparison to "n". Furthermore, "p$^+$" represents a p-type impurity concentration that is relatively higher in comparison to "p", and "p$^-$" represents a p-type impurity concentration that is relatively lower in comparison to "p". Furthermore, "n$^+$-type" and "n$^-$-type" may be simply described as "n-type", and "p$^+$-type" and "p$^-$-type" may be simply described as "p-type".

For example, the impurity concentration can be measured by secondary ion mass spectrometry (SIMS). In addition, for example, the relative magnitude of the impurity concentration can be determined from the magnitude of the carrier concentration that is obtained by scanning capacitance microscopy (SCM). In addition, for example, a distance such as a depth of an impurity region can be obtained by SIMS. In addition, for example, the distance such as the depth of the impurity region can be obtained from a composite image of an SCM image and an atomic force microscope (AFM) image.

First Embodiment

Figure 2:
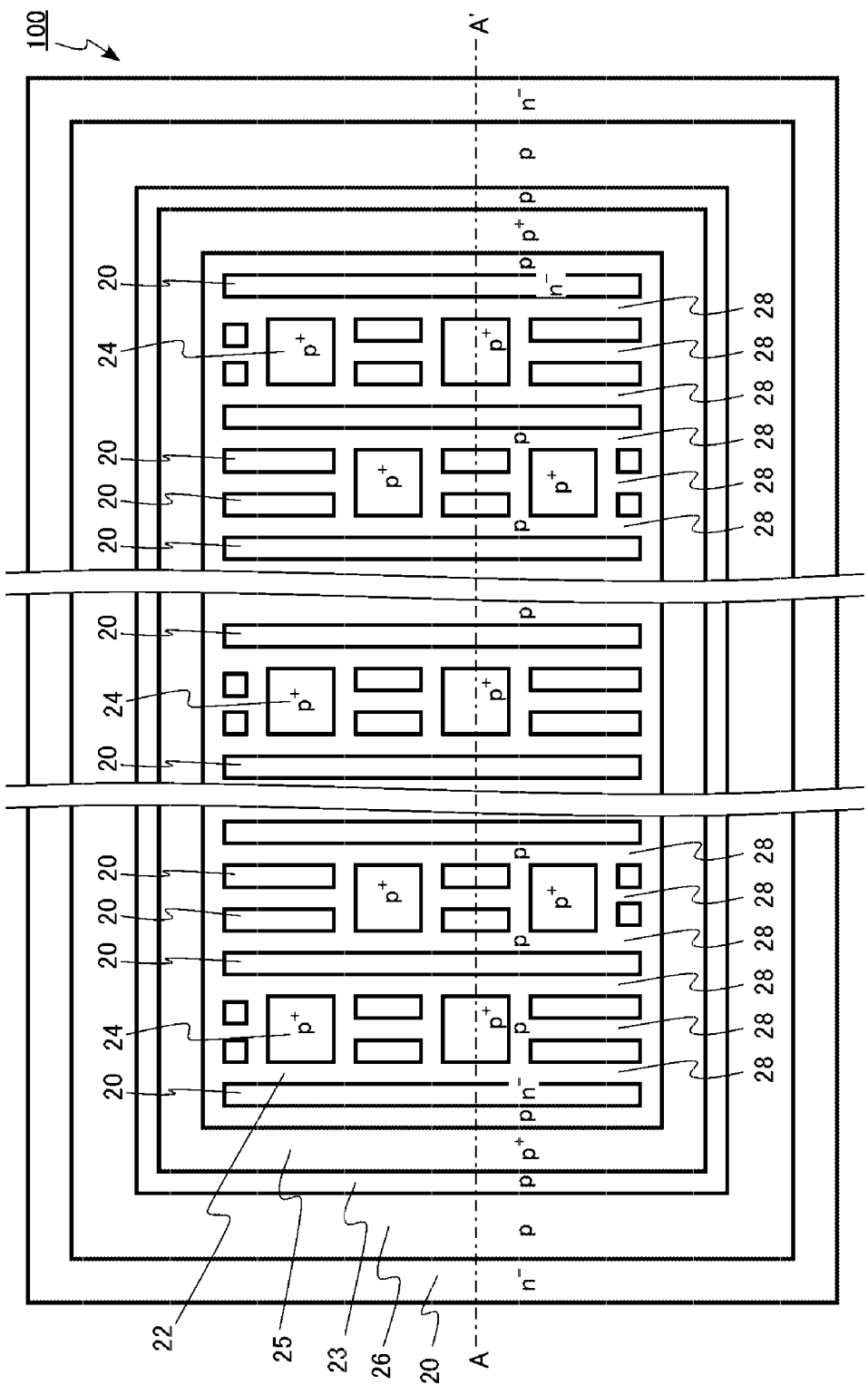
FIG. 2 is a schematic top plan view of the semiconductor device according to the first embodiment.
Figure 3:
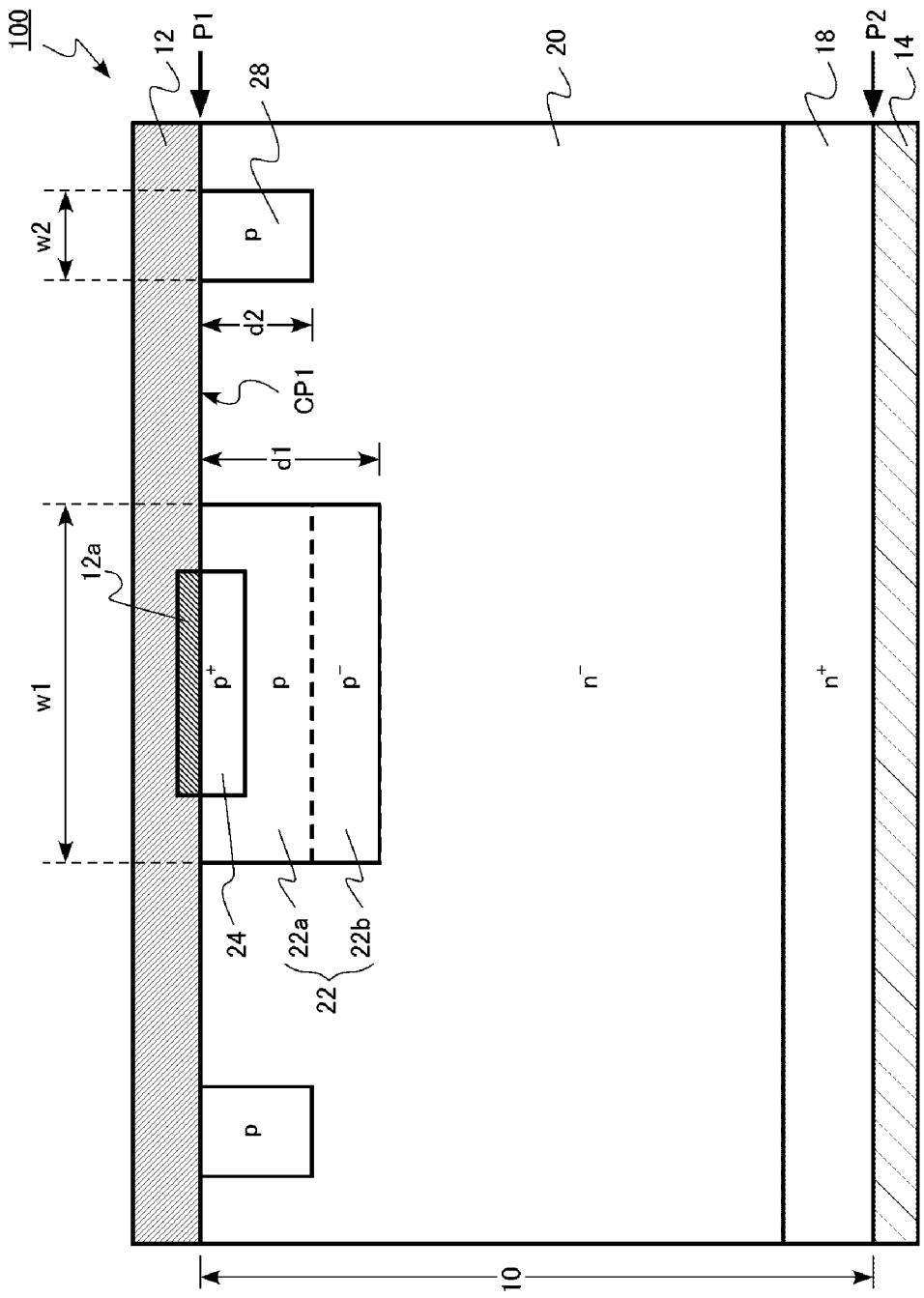
FIG. 3 is an enlarged partial cross-sectional view of the semiconductor device according to the first embodiment.

FIG. 1 is a schematic cross-sectional view of the semiconductor device according to this embodiment. FIG. 2 is a schematic top plan view of the semiconductor device according to this embodiment. FIG. 2 illustrates an impurity region on a first plane side of the semiconductor layer. FIG. 1 corresponds to a cross-section taken along line A-A' in FIG. 2. FIG. 3 is an enlarged partial cross-sectional view of the semiconductor device according to this embodiment.

The semiconductor device according to this embodiment is an MPS 100. The MPS 100 includes an element region and a termination region. The element region is surrounded by the termination region.

The element region functions as a region through which a current flows mainly during forward bias of the MPS 100. The termination region functions as a region that mitigates the strength of an electric field that is applied to the ends (sides) of the element region during reverse bias of the MPS 100, and improves the element breakdown voltage of the MPS 100.

The MPS 100 includes a SiC layer (semiconductor layer; silicon carbide layer) 10, an anode electrode (first electrode) 12, a cathode electrode (second electrode) 14, and a field oxide film 16. The SiC layer 10 includes a first plane ("P1" in FIG. 1) and a second plane ("P2" in FIG. 1).

At least a portion of the SiC layer 10 is provided between the anode electrode 12 and the cathode electrode 14. The anode electrode 12 is provided on the first plane of the SiC layer 10. The cathode electrode 14 is provided on the second plane of the SiC layer 10. The field oxide film 16 is provided on the first plane of the SiC layer 10.

The SiC layer 10 includes a n$^+$-type cathode region 18, an n$^-$-type drift region (first semiconductor region) 20, a p-type first anode region (second semiconductor region) 22, a p$^+$-type second anode region (third semiconductor region) 24, a p-type reserve region (fifth semiconductor region) 26, a p-type region (fourth semiconductor region) 28, a p-type edge region 23, and a p$^+$-type edge contact region 25.

The p-type first anode region 22, the p$^+$-type second anode region 24, the p-type region 28, the p-type edge region 23, and the p$^+$-type edge contact region 25 are provided in the element region. The p-type reserve region 26 is provided in the termination region.

The SiC layer 10 is single-crystal SiC (silicon carbide). For example, the SiC layer 10 crystal structure is 4H—SiC. Herein, the description will be given of a case where the first plane of the SiC layer 10 is a plane that is inclined with respect to a (0001) plane by 0° to 8°, and the second plane is a plane that is inclined with respect to a (000-1) plane by 0° to 8° as an example. The (0001) plane is referred to as a silicon plane. The (000-1) plane is referred to a carbon plane.

The n$^+$-type cathode region 18 is provided in the SiC layer 10. The n$^+$-type cathode region 18 is provided between the cathode electrode 14 and the n$^-$-type drift region 20.

The n$^+$-type cathode region 18 contains an n-type impurity. An example of the n-type impurity is nitrogen (N). The impurity concentration of the n-type impurity in the n$^+$-type cathode region 18 is higher than the impurity concentration of an n-type impurity in the n$^-$-type drift region 20. For example, the impurity concentration of the n-type impurity in the n$^+$-type cathode region 18 is $1 \times 10^{18}$ cm$^{-3}$ to $1 \times 10^{21}$ cm$^{-3}$.

The n$^-$-type drift region 20 is provided in the SiC layer 10. The n$^-$-type drift region 20 is provided on the n$^+$-type cathode region 18. The n$^-$-type drift region 20 functions as a region which allows a carrier to flow.

A portion of the n$^-$-type drift region 20 is in contact with the anode electrode 12 at the first plane. The contact plane between the anode electrode 12 and the n$^-$-type drift region 20 is also referred to as "first contact plane ("CP1" in FIG. 3).

Contact between the anode electrode 12 and the n$^-$-type drift region 20 is a Schottky contact. The regions in which the anode electrode 12 and the n$^-$-type drift region 20 are in contact with each other become Schottky regions that allow an on-state current to flow during forward bias.

The n$^-$-type drift region 20 contains an n-type impurity. Examples of the n-type impurity include nitrogen (N). For example, the impurity concentration of the n-type impurity in the n$^-$-type drift region 20 is from $1 \times 10^{15}$ cm$^{-3}$ to $2 \times 10^{16}$ cm$^{-3}$. For example, the thickness of the n$^-$-type drift region 20 is from 3 μm to 30 μm.

Furthermore, an n-type buffer layer (not illustrated) may be provided between the n$^+$-type cathode region 18 and the n$^-$-type drift region 20. An impurity concentration of the n-type impurity in the n-type buffer layer is a concentration between the impurity concentration of the n$^+$-type cathode region 18 and the impurity concentration of the n$^-$-type drift region 20.

The p-type first anode region 22 is provided in the SiC layer 10. The p-type first anode region 22 is provided between the anode electrode 12 and the n$^-$-type drift region 20 and extends inwardly of the n$^-$-type drift region 20 from the first plane P1. The p-type first anode region 22 is in contact with the anode electrode 12 at the first plane P1.

For example, the p-type first anode region 22 is provided to surround the p$^+$-type second anode region 24 as illustrated in FIG. 2.

The p-type first anode region 22 contains a p-type impurity. An example of the p-type impurity is aluminum (Al). For example, an impurity concentration of the p-type impurity in the p-type first anode region 22 is from $1 \times 10^{16}$ cm$^{-3}$ to $5 \times 10^{18}$ cm$^{-3}$.

The p-type first anode region 22 includes a first region 22a and a second region 22b as shown in FIG. 3. The second region 22b is provided between the first region 22a and the drift region 20.

An impurity concentration of a p-type impurity in the second region 22b is lower than an impurity concentration of a p-type impurity in the first region 22a. For example, the impurity concentration of the p-type impurity in the first region 22a is from $5 \times 10^{16}$ cm$^{-3}$ to $5 \times 10^{18}$ cm$^{-3}$. For example, the impurity concentration of the p-type impurity in the second region 22b is from $1 \times 10^{16}$ cm$^{-3}$ to $1 \times 10^{17}$ cm$^{-3}$.

For example, a width ("w1" in FIG. 1 and FIG. 3) of the p-type first anode region 22 is from 3.0 μm to 15.0 μm.

When the depth ("d1" in FIG. 3) of the p-type first anode region 22 from the first contact plane ("CP1" in FIG. 3) is d1 (μm), and the impurity concentration of the n-type impurity in the n$^-$-type drift region 20 is D (atom/cm$^3$ or cm$^{-3}$), the following equation is satisfied.

$$d1 \geq -5E-34D^2 + 1E-16D + 0.074 \quad \text{(Equation)}$$

For example, the depth d1 of the contact location of the furthest position of the p-type first anode region 22 from the first contact plane CP1 with the drift layer 20 is from 0.7 μm to 2.0 μm.

The p$^+$-type second anode region 24 is provided in the SiC layer 10 and extends inwardly of the p-type first anode region 22 from the first contact plane CP1. The p$^+$-type second anode region 24 is thus provided between the anode electrode 12 and the p-type first anode region 22.

The p$^+$-type second anode region 24 contacts the anode electrode 12 at first plane P1. The contact between the anode electrode 12 and the p$^+$-type second anode region 24 is an ohmic contact.

The p$^+$-type second anode region 24 contains a p-type impurity. An example of the p-type impurity is aluminum (Al). An impurity concentration of the p$^+$-type second anode region 24 is higher than the impurity concentration of the p-type first anode region 22. For example, the impurity concentration of the p-type impurity in the p$^+$-type second anode region 24 is from $1\times10^{19}$ cm$^{-3}$ to $1\times10^{21}$ cm$^{-3}$.

A width of the p$^+$-type second anode region 24 is narrower than the width w1 of the p-type first anode region 22. For example, the width of the p$^+$-type second anode region 24 is from 2.0 µm to 12.0 µm.

For example, a depth of the p$^+$-type second anode region 24 from the first contact plane CP1 is from 0.05 µm to 0.5 µm, and it thus terminates in the p-type first anode region 22.

The region where the p-type first anode region 22 and the p$^+$-type second anode region 24 are located forms a PIN diode region in conjunction with adjacent portions of the drift layer 20. When a forward surge current occurs, the PIN diode region allows a large amount of current to flow by using conductivity modulation due to hole injection. According to this, the PIN diode region has a function of suppressing breakdown of the MPS 100 due to heat generation and the like.

The p-type region 28 is provided in the SiC layer 10. The p-type region 28 is provided between the anode electrode 12 and the n$^-$-type drift region 20. The p-type region 28 is in contact with the anode electrode 12 at the first plane P1.

For example, the p-type region 28 has a stripe shape as illustrated in FIG. 2. A portion of the p-type region 28 is in contact with the p-type first anode region 22.

The p-type region 28 is surrounded by the p-type reserve region 26. For example, the p-type region 28 is formed simultaneously with the first region 22a of the p-type first anode region 22 in the same process step.

The p-type region 28 has a function of suppressing a leakage current during reverse bias. A depletion layer is broadened in the drift region 20 between two p-type regions 28 during the reverse bias, and thus an electric field between the anode electrode 12 and the n$^-$-type drift region 20 is mitigated. As a result, the leakage current of the MPS 100 is suppressed.

The width ("w2" in FIG. 1 and FIG. 3) of the p-type region 28 is narrower than the width ("w1" in FIG. 1 and FIG. 3) of the p-type first anode region 22. That is, w2<w1. For example, the width w2 of the p-type region 28 is from 1.0 µm to 3.0 µm. The gaps between adjacent ones of the plurality of the p-type regions 28 is from 1.0 µm to 5.0 µm.

A depth ("d2" in FIG. 3) of the p-type region 28 from the first contact plane CP1 is shallower than the depth d1 of the p-type first anode region 22 from the first contact plane CP1. That is, d2≤d1. For example, the depth d2 of the p-type region 28 from the first contact plane CP1 is from 0.4 µm to 1.0 µm.

The p-type region 28 contains a p-type impurity. An example of the p-type impurity is aluminum (Al).

The impurity concentration of the p-type impurity in the p-type region 28 is lower than the impurity concentration of the p-type impurity in the p$^+$-type second anode region 24. The impurity concentration of the p-type impurity in the p-type region 28 is approximately the same as the impurity concentration of the p-type impurity in the first region 22a of the p-type first anode region 22. For example, the impurity concentration of the p-type impurity in the p-type region 28 is from $5\times10^{16}$ cm$^{-3}$ to $5\times10^{18}$ cm$^{-3}$.

The p-type edge region 23 is provided in the SiC layer 10. The p-type edge region 23 is provided between the anode electrode 12 and the n$^-$-type drift region 20.

For example, as illustrated in FIG. 2, the p-type edge region 23 is provided in an annular shape at the outer peripheral portion of the element region. For example, the p-type edge region 23 is formed simultaneously with the p-type first anode region 22 in the same process step.

The p-type edge region 23 contains a p-type impurity. Examples of the p-type impurity include aluminum (Al). For example, an impurity concentration of the p-type impurity is from $5\times10^{16}$ cm$^{-3}$ to $5\times10^{18}$ cm$^{-3}$.

For example, a depth of the p-type edge region 23 from the first contact plane CP1 is from 0.7 µm to 2.0 µm. A depth of the p-type edge region 23 is the same as that of the p-type first anode region 22.

The p$^+$-type edge contact region 25 is provided in the SiC layer 10. The p$^+$-type edge contact region 25 is provided between the anode electrode 12 and the p-type edge region 23. The p$^+$-type edge contact region 25 is provided in the p-type edge region 23.

The p$^+$-type edge contact region 25 contacts the anode electrode 12. The contact between the anode electrode 12 and the p$^+$-type edge contact region 25 is an ohmic contact.

For example, as illustrated in FIG. 2, the p$^+$-type edge contact region 25 is provided in an annular shape at the outer peripheral portion of the element region. For example, the p$^+$-type edge contact region 25 is formed simultaneously with the p$^+$-type second anode region 24 in the same process step.

The p$^+$-type edge contact region 25 contains a p-type impurity. Examples of the p-type impurity include aluminum (Al). The impurity concentration of the p-type impurity in the p$^+$-type edge contact region 25 is higher than the impurity concentration of the p-type impurity in the p-type edge region 23. For example, the impurity concentration of the p-type impurity is from $1\times10^{19}$ cm$^{-3}$ to $1\times10^{21}$ cm$^{-3}$.

For example, a depth of the p$^+$-type edge contact region 25 from the first contact plane CP1 is from 0.05 µm to 0.5 µm.

The p-type reserve region 26 is provided in the SiC layer 10. The p-type reserve region 26 surrounds the p-type first anode region 22 and the p-type region 28. The p-type reserve region 26 is electrically connected to the anode electrode 12.

The distance between the p-type reserve region 26 and the cathode electrode 14 is greater than the distance between the p-type first anode region 22 and the cathode electrode 14. In other words, the depth of the p-type reserve region 26 from the first contact plane CP1 is shallower than the depth d1 of the p-type first anode region 22 from the first contact plane CP1.

The p-type reserve region 26 has a junction termination extension (JTE) structure for an improvement in the breakdown voltage of the MPS 100.

The p-type reserve region 26 contains a p-type impurity. An example of the p-type impurity is aluminum (Al). For example, an impurity concentration of the p-type impurity is from $1\times10^{16}$ cm$^{-3}$ to $1\times10^{18}$ cm$^{-3}$.

The impurity concentration of the p-type impurity in the p-type reserve region 26 is lower than the impurity concentration of the p-type impurity in the p-type edge contact region 25.

The field oxide film 16 is provided on the p-type reserve region 26. For example, the field oxide film 16 is a silicon oxide film. The field oxide film 16 includes an opening. For example, the film thickness of the field oxide film 16 is from 0.2 µm to 1.0 µm.

The anode electrode 12 is in contact with the n$^-$-type drift region 20, the p-type first anode region 22, the p$^+$-type second anode region 24, the p-type edge region 23, and the p$^+$-type edge contact region 25 at the opening of the field oxide film 16.

The anode electrode 12 is a metal. For example, the anode electrode 12 is a stacked film of titanium (Ti) and aluminum (Al).

The anode electrode 12 includes a silicide region 12a. The silicide region 12a is located where the anode electrode 12 contacts the p$^+$-type second anode region 24. In addition, the silicide region 12a is located where the anode electrode 12 contacts the p$^+$-type edge contact region 25.

When the silicide region 12a is provided, it is easy to achieve an ohmic contact between the anode electrode 12, and the p$^+$-type second anode region 24 and the p$^+$-type edge contact region 25.

For example, the silicide region 12a is nickel silicide or titanium silicide. For example, the thickness of the silicide region 12a is from 0.05 µm to 0.3 µm.

The cathode electrode 14 contacts the n$^+$-type cathode region 18. The contact between the cathode electrode 14 and the n$^+$-type cathode region 18 is an ohmic contact.

The cathode electrode 14 is a metal. For example, the cathode electrode 14 is a stacked film of titanium (Ti) and aluminum (Al).

Next, description will be given of the operation and effect of the MPS 100 according to this embodiment.

FIG. 4, FIGS. 5A and 5B, and FIG. 6 are explanatory views of the operation and effect of this embodiment.

Figure 4:
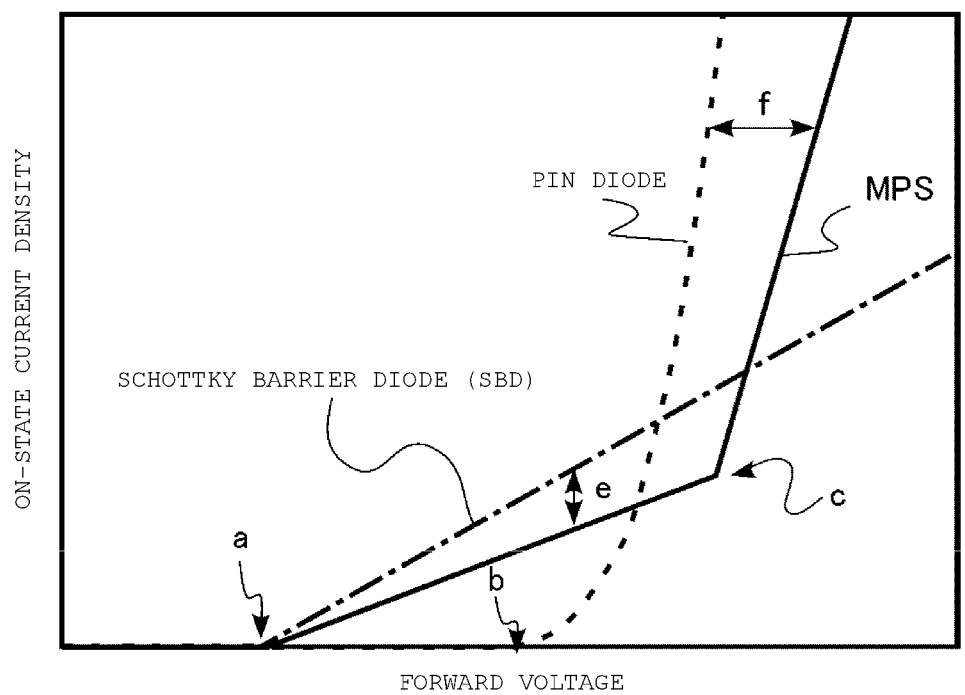
FIG. 4 is an explanatory view of the operation and effect of the semiconductor device according to the first embodiment.

FIG. 4 is an explanatory view of a relationship between a forward voltage and an on-state current density of various semiconductor rectifiers. Cases of the Schottky barrier diode (SBD), the PIN diode, and the MPS are illustrated.

The on-state current density of the SBD, which is illustrated by a dash-dot chain line, initially rises from a voltage indicated by an arrow "a". The initial voltage is determined a Schottky barrier height ($\phi$B) of a Schottky junction between an anode electrode and an n-type impurity region. In a case of SiC, the initial voltage is approximately 1.0 V.

On the other hand, the on-state current density of the PIN diode, which is indicated by a short dash line, initially rises from a voltage indicated by an arrow "b". The initial voltage is determined by a built-in potential (Vbi) of a pn junction. In a case of SiC, the initial voltage is approximately 2.5 V.

In a case of the MPS provided with both the Schottky junction and the pn junction, the on-state current density indicated by a solid line initially rises from a voltage indicated by the arrow "a". When reaching a voltage, at which hole injection occurs, indicated by an arrow "c", known as a hole injection voltage, conductivity modulation occurs, and the on-state current density rapidly increases. When the hole injection voltage is lowered, heat generation energy is suppressed, and it is possible to reduce the breakdown rate of the MPS when a forward surge current occurs.

In addition, because the proportion of area occupied by the PIN diode region provided to the MPS is increased, a difference, indicated by a two-way arrow "e", in the on-state current density between the MPS and the SBD increases. This is because the proportion of the area occupied by the Schottky region, which allows a forward current to flow, is correspondingly relatively reduced. When the difference, which is indicated by the two-way arrow "e", in the on-state current density between the MPS and the SBD decreases, the on-state current density during a typical operation rises.

In addition, as the proportion of the area occupied by the PIN diode region is increased, a difference, which is indicated by a two-way arrow "f", in the on-state current density between the MPS and the PIN diode decreases. This is because an amount of current which is capable of flowing from the PIN diode region increases. When the difference, which is indicated by the two-way arrow "f", in the on-state current density is decreased, forward surge resistance is improved.

Accordingly, it is effective to increase the area occupied by the PIN diode region so as to improve the forward surge resistance. However, in this case, the area occupied by the Schottky region is reduced, and thus the on-state current density during a typical operation is sacrificed.

Figure 5A:
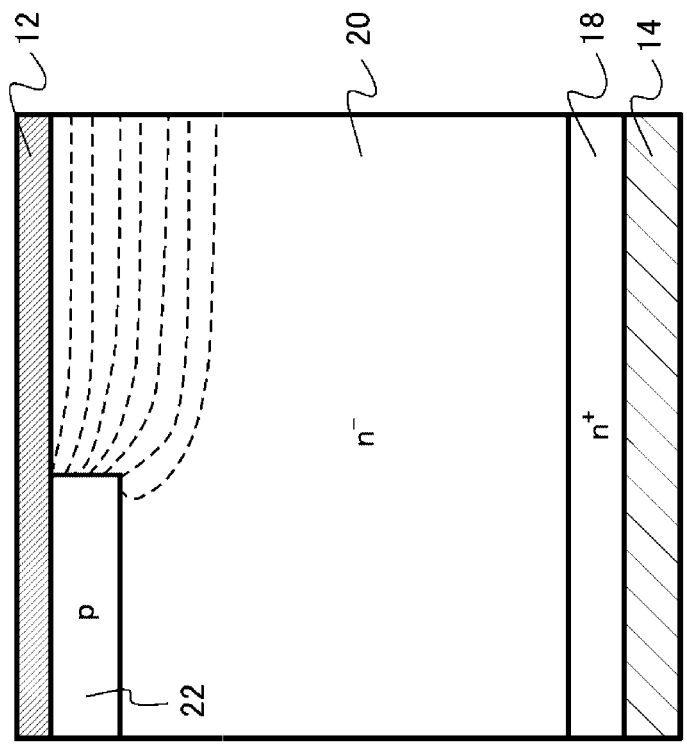
FIGS. 5A and 5B are explanatory views of the operation and effect of the semiconductor device according to the first embodiment.
Figure 5B:
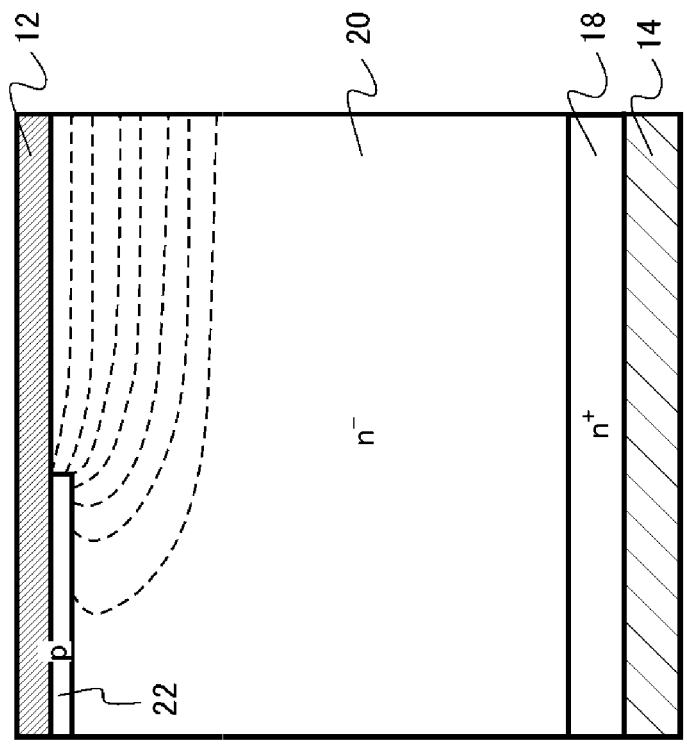

FIGS. 5A and 5B illustrate an electrostatic potential distribution when a forward bias is applied between the anode electrode 12 and the cathode electrode 14.

FIG. 5A illustrates a case where the depth of a p-type anode region (corresponding to the p-type first anode region 22) is shallow, and FIG. 5B illustrates a case where the depth of the p-type anode region (corresponding to the p-type first anode region 22) is deep.

As illustrated in FIG. 5A, when the depth of the p-type anode region is shallow, wraparound of the electrostatic potential to the bottom of the p-type anode region is great. This is because voltage drop occurs due to a forward current that flows in a manner of wrapping around to the bottom of the p-type anode region.

At a portion in which the wraparound of the electrostatic potential to the bottom of the p-type anode region occurs, a sufficient voltage is not applied to the pn junction. Accordingly, when a forward surge current occurs, it is less likely to reach a hole injection voltage. According to this, it is necessary to further increase a width (corresponding to w1 in this embodiment) of the p-type anode region above a predetermined value. For example, the predetermined value is 15 µm or greater.

When the width of the p-type anode region is broadened so as to increase forward surge current resistance, the area occupied by the PIN diode region is increased. Accordingly, there is a problem that the on-state current density during a typical operation is sacrificed as described above.

As illustrated in FIG. 5B, when the depth of the p-type anode region is greater, the wraparound of the electrostatic potential to the bottom of the p-type anode region is suppressed. Accordingly, it is possible to make the width (corresponding to "w1" in this embodiment) of the p-type anode region narrower in comparison to the case where the depth of the p-type anode region is shallow. Accordingly, it is possible to increase the on-state current density during a typical operation by further reducing the area occupied by the PIN diode region in comparison to the case where the depth of the p-type anode region is shallow.

In the MPS 100 according to this embodiment, the depth d1 of the p-type first anode region 22 is set to be deeper than the depth d2 of the p-type region 28. According to this, wraparound of the electrostatic potential to the bottom of the p-type first anode region 22 is suppressed. Accordingly, it is possible to increase the on-state current density during a typical operation by reducing the width w1 of the p-type first anode region 22.

FIG. 6 illustrates a relationship between the impurity concentration of the n-type impurity in the n$^-$-type drift region 20 and the depth (corresponding to "d1" in this embodiment) of the p-type anode region (corresponding to the p-type first anode region 22). FIG. 6 illustrates a depth, which is necessary to suppress wraparound of an electrostatic potential of the p-type anode region.

Through a simulation, 4.0 V is applied between the anode electrode 12 and the cathode electrode 14, and a depth (a black circle mark in FIG. 6), at which an equipotential line of 3.8 V does not wrap around to the bottom of the p-type anode region, is obtained. In addition, a depth (a white circle mark in FIG. 6), at which wraparound of the equipotential line of 3.8 V to the bottom of the p-type anode region reaches 1 μm, is obtained.

When a region of less than 3.8 V occurs at the bottom of the p-type anode region, there is a concern that hole injection may be inhibited at the region. In other words, the electrostatic potential of 3.8 V is the boundary between a region in which the amount of hole injection is great and a region in which the amount of hole injection is smaller. In a case of miniaturization that can be obtained through development, a width of the p-type anode region is approximately from 3 μm to 6 μm. In this case, when the wraparound of the equipotential line of 3.8 V to the bottom of the p-type anode region is from 1 μm or less, it is possible to suppress inhibition of the hole injection. In addition, when the equipotential line of 3.8 V does not wrap around to the bottom of the p-type anode region, it is possible to further suppress the inhibition of the hole injection.

As illustrated in FIG. 6, if (a white circle mark in FIG. 6) the wraparound of the equipotential line of 3.8 V to the bottom of the p-type anode region is 1 μm, when the depth of the p-type anode region is d1 (μm) and the impurity concentration of the n-type impurity in the n⁻-type drift region 20 is D (cm⁻³), the following equation is satisfied.

$$d1 = -5E\text{-}34D^2 + 1E\text{-}16D + 0.074 \quad \text{(Equation)}$$

Accordingly, in this embodiment, when the depth ("d1" in the drawing) of the p-type first anode region 22 from the first contact plane ("CP1" in FIG. 3) is set as d1 (μm), and the impurity concentration of the n-type impurity in the n⁻-type drift region 20 is set as D (cm⁻³), it is preferable to satisfy the following equation from the viewpoint of suppressing wraparound of the electrostatic potential.

$$d1 \geq -5E\text{-}34D^2 + 1E\text{-}16D + 0.074 \quad \text{(Equation)}$$

In addition, as illustrated in FIG. 6, wraparound of the equipotential line of 3.8 V to the bottom of the p-type anode region will not occur (a black circle mark in FIG. 6), when the depth of the p-type anode region is set as d1 (μm), and the impurity concentration of the n-type impurity in the n⁻-type drift region 20 is set as D (cm⁻³) and the following equation is satisfied.

$$d1 = -1E\text{-}33D^2 + 2E\text{-}16D + 0.3484 \quad \text{(Equation)}$$

Accordingly, in this embodiment, when the depth ("d1" in the drawing) of the p-type first anode region 22 from the first contact plane ("CP1" in FIG. 3) is set as d1 (μm), and the impurity concentration of the n-type impurity in the n⁻-type drift region 20 is set as D (cm⁻³), it is preferable to satisfy the following equation from the viewpoint of further suppressing wraparound of the electrostatic potential.

$$d1 \geq -1E\text{-}33D^2 + 2E\text{-}16D + 0.3484 \quad \text{(Equation)}$$

Furthermore, when the depth of the p-type first anode region 22 is deep, the effective thickness of the n⁻-type drift region 20 between the first anode region 22 and the electrode 14 becomes smaller. Accordingly, there is a concern that the breakdown voltage of the MPS 100 will decrease.

In the MPS 100 according to this embodiment, the second region 22b, in which the impurity concentration of the p-type impurity is low is provided at the bottom of the p-type first anode region 22. When the second region 22b is provided, a profile of pn junction is made to be gentle, and a decrease in the breakdown voltage of the MPS 100 is suppressed.

In addition, in the MPS 100 according to this embodiment, the depth d2 of the p-type region 28 is shallower than the depth d1 of the p-type first anode region 22. The depth d2 of the p-type region 28 does not have an influence to improve the forward surge current resistance, and thus it is not necessary for the depth d2 to be deep.

In addition, when the depth d2 of the p-type region 28 is shallower than the depth d1 of the p-type first anode region 22, avalanche breakdown during reverse bias is likely to occur in the p-type first anode region 22 in comparison to the p-type region 28. In other words, occurrence of the avalanche breakdown is suppressed in the p-type region 28.

In the PIN diode region, a contact of the anode electrode 12 is an ohmic contact, and contact resistance is low. Accordingly, hole extracting capability when the avalanche breakdown occurs is higher in comparison to the p-type region 28. In a structure in which the avalanche breakdown is likely to occur at the p-type first anode region 22 in comparison to the p-type region 28, breakdown of the MPS 100 due to heat generation and the like caused by the avalanche breakdown is suppressed. Accordingly, avalanche resistance of the MPS 100 is improved.

In addition, it is preferable that the avalanche breakdown occurs in the PIN diode region in comparison to a termination structure from the viewpoint of improving the avalanche resistance. This is because the avalanche breakdown occurs over a dispersed region in comparison to the termination structure, and thus heat generation and the like due to the avalanche breakdown is suppressed.

According to this, in the MPS 100 according to this embodiment, it is preferable that a distance between the p-type reserve region 26 and the cathode electrode 14 is set to be longer than a distance between the p-type first anode region 22 and the cathode electrode 14. The thickness of the n⁻-type drift region 20 corresponding to a portion of the p-type reserve region 26 becomes larger in comparison to the p-type first anode region 22. Accordingly, the breakdown voltage at a portion of the p-type reserve region 26 is further improved in comparison to the PIN diode region. Accordingly, the avalanche breakdown is likely to occur in the PIN diode region in comparison to the termination structure.

In addition, in the MPS 100 according to this embodiment, a portion of the p-type region 28 is in contact with the p-type first anode region 22. When the p-type region 28 is in contact with the p-type first anode region 22 in the PIN diode region, when a forward surge current occurs, a hole propagates from the PIN diode region to the p-type region 28, and thus even in the p-type region 28 with a narrow width, hole injection occurs. Accordingly, it is possible to disperse the hole injection over a wide range of the element region. As a result, it is possible to disperse a heat generation region, and thus it is possible to further improve the forward surge resistance.

Furthermore, it is possible to employ a configuration in which impurity concentrations of the p-type impurity in the first region 22a and the second region 22b are set to be approximately the same as each other.

According to this embodiment, it is possible to achieve the MPS 100 which has high forward surge resistance, and is capable of increasing the on-state current density during a typical operation. In addition, it is possible to achieve an MPS 100 in which the avalanche resistance is improved.

Second Embodiment

A semiconductor device according to this embodiment is different from the first embodiment in that a width of a second region of a second semiconductor region is wider than a width of a first region. Hereinafter, description of contents redundant to those in the first embodiment will be omitted.

Figure 7:
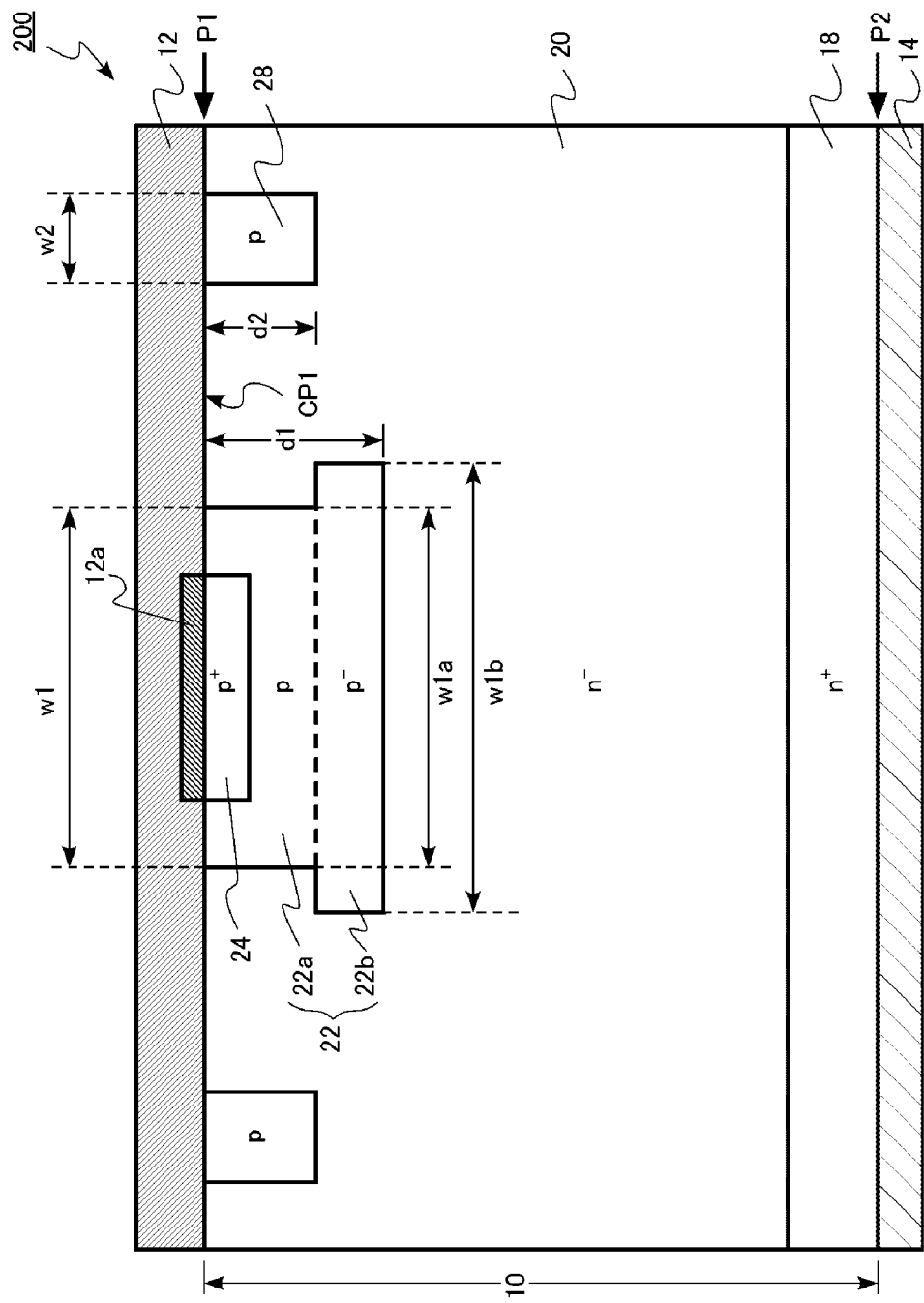
FIG. 7 is an enlarged partial cross-sectional view of a semiconductor device according to a second embodiment.

FIG. 7 is a partially enlarged cross-sectional view of the semiconductor device according to this embodiment.

In an MPS 200 according to this embodiment, a p-type first anode region 22 includes a first region 22a and a second region 22b. The second region 22b is provided between the first region 22a and the drift region 20.

The impurity concentration of a p-type impurity in the second region 22b is lower than an impurity concentration of a p-type impurity in the first region 22a. For example, the impurity concentration of the p-type impurity in the first region 22a is from $5 \times 10^{16}$ cm$^{-3}$ to $5 \times 10^{18}$ cm$^{-3}$. For example, the impurity concentration of the p-type impurity in the second region 22b is from $1 \times 10^{16}$ cm$^{-3}$ to $1 \times 10^{17}$ cm$^{-3}$.

A width ("w1b" in FIG. 7) of the second region 22b is wider than a width ("w1a" in FIG. 7) of the first region 22a. For example, a difference (w1b–w1a) between the width w1b of the second region 22b and the width w1a of the first region 22a is from 1 μm to 4 μm.

When the width w1b of the second region 22b is wider than the width w1a of the first region 22a, wraparound of an electrostatic potential to the bottom of the second region 22b can be further suppressed in comparison to the first embodiment. Accordingly, it is possible to further increase the on-state current density during a typical operation by further reducing the width w1 of the p-type first anode region 22 in comparison to the first embodiment.

Furthermore, it is also possible to employ a configuration in which the impurity concentrations of the p-type impurity in the first region 22a and the second region 22b are substantially the same as each other.

According to this embodiment, it is possible to achieve the MPS 200 which has high forward surge resistance, and is capable of increasing the on-state current density during a typical operation. In addition, it is possible to further increase the on-state current density during a typical operation in comparison to the first embodiment.

Third Embodiment

A semiconductor device according to this embodiment is different from the first embodiment in that the distance from a second contact plane CP2 between the first electrode and the third semiconductor region to the second electrode is shorter than the distance from the first contact plane CP1 to the second electrode. Hereinafter, description of contents redundant to those in the first embodiment will be omitted.

Figure 8:
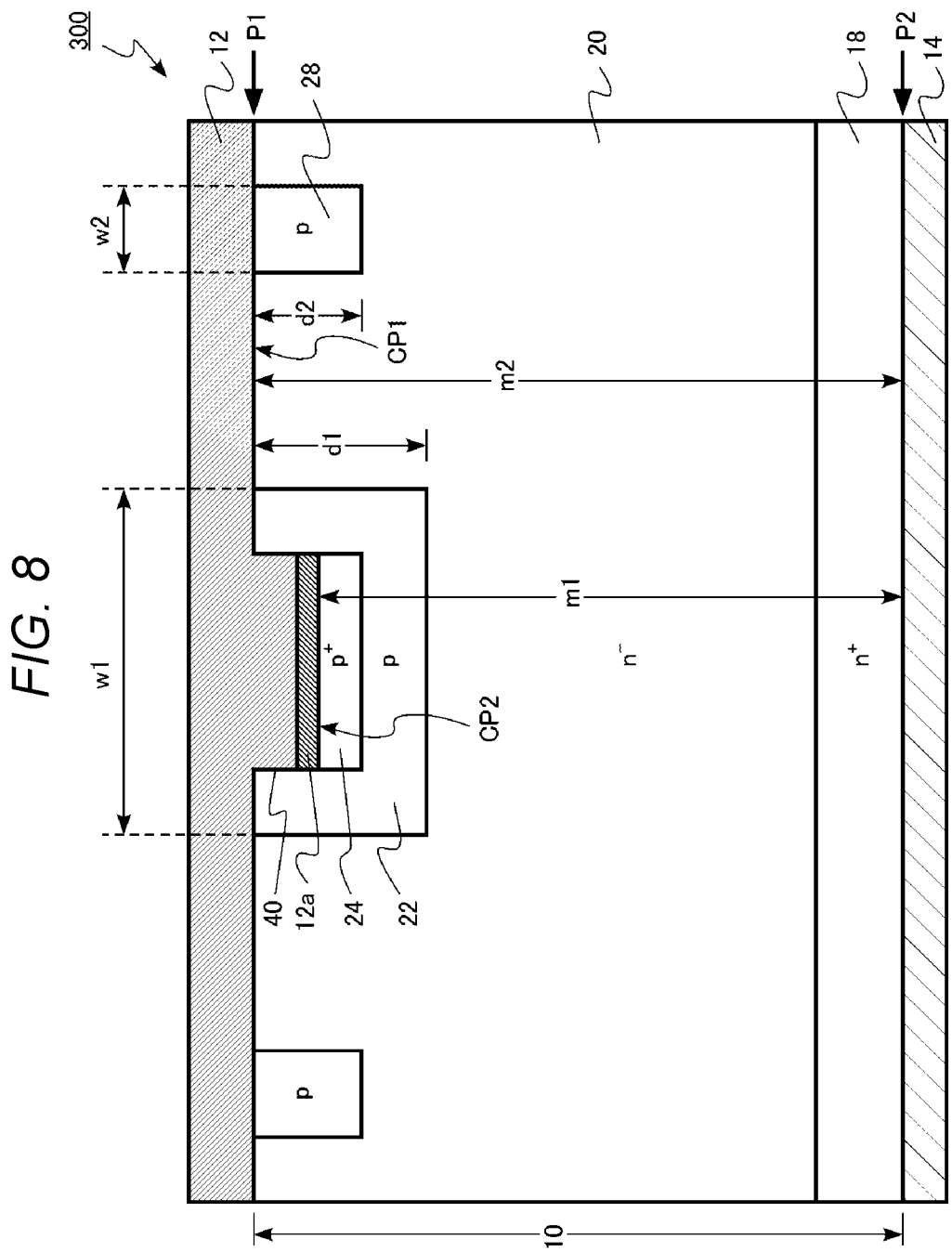
FIG. 8 is an enlarged partial cross-sectional view of a semiconductor device according to a third embodiment.

FIG. 8 is a partially enlarged cross-sectional view of a semiconductor device according to this embodiment.

In an MPS 300 according to this embodiment, a distance ("m1" in FIG. 8) from the second contact plane ("CP2" in FIG. 8) between the anode electrode 12 and the p$^+$-type second anode region 24 to the cathode electrode 14 is shorter than a distance ("m2" in FIG. 8) from the first contact plane ("CP1" in FIG. 8) between the anode electrode 12 and the n$^-$-type drift region 20 to the cathode electrode 14.

The p$^+$-type second anode region 24 and a portion of the p-type first anode region 22 are formed below a trench 40 formed inwardly of the first plane P1 of the SiC layer 10. For example, the p$^+$-type second anode region 24 and the p-type first anode region 22 are formed by ion implantation of a p-type impurity after forming the trench 40. For example, the p-type first anode region 22 on the sides of the trench 40 is formed by oblique ion implantation of a p-type impurity after forming the trench 40.

According to this embodiment, ion implantation is performed after forming the trench 40, and thus a p-type first anode region 22 that extends deep into the drift layer 20 can be achieved without using ion implantation requiring high acceleration energy. Accordingly, it is possible to form a deep p-type first anode region 22 using a low-cost manufacturing method.

According to this embodiment, as is the case with the first embodiment, it is possible to achieve an MPS 300 that has high forward surge resistance and is capable of increasing the on-state current density during a typical operation. In addition, it is possible to manufacture the MPS 300, which is capable of increasing the on-state current density, at the low cost.

Fourth Embodiment

A semiconductor device according to this embodiment is different from the first embodiment in that the depth of the second semiconductor region at a portion thereof in contact with the first electrode extends from the first contact plane deeper than the depth of the second semiconductor region from the first contact plane at a portion thereof interposed between the third semiconductor region and the first semiconductor region, from the first contact plane. Hereinafter, description of contents redundant to those in the first embodiment will be omitted.

Figure 9:
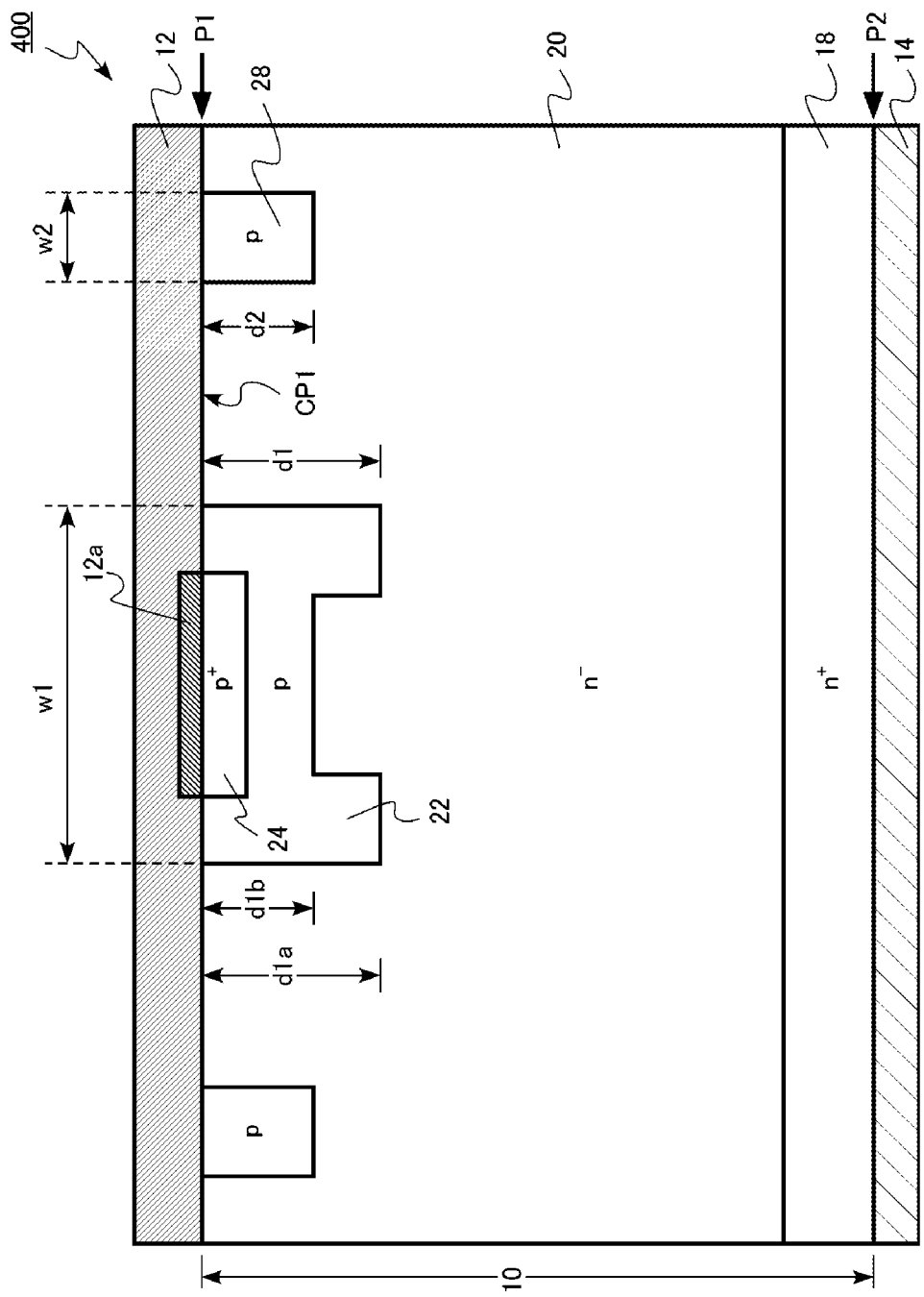
FIG. 9 is an enlarged partial cross-sectional view of a semiconductor device according to a fourth embodiment.

FIG. 9 is a partially enlarged cross-sectional view of the semiconductor device according to this embodiment.

In an MPS 400 according to this embodiment, the depth ("d1a" in FIG. 9) of the p-type first anode region 22 from the first contact plane CP1 at a portion thereof in contact with the anode electrode 12 from the first contact plane CP1 is deeper than a depth ("d1b" in FIG. 9) of the p-type first anode region 22 at the portion thereof interposed between the p$^+$-type second anode region 24 and the n$^-$-type drift region 20. In other words, the depth of the p-type first anode region 22 from the first plane P1 is deep at the end or sides thereof and is shallow at the center thereof.

According to this embodiment, at the ends of the p-type first anode region 22 where the depth of the region is deep, it is possible to suppress wraparound of the electrostatic potential to the bottom of the p-type first anode region 22.

According to this embodiment, as is the case with the first embodiment, it is possible to achieve the MPS 400 that has high forward surge resistance, and is capable of increasing the on-state current density during a typical operation.

Fifth Embodiment

A semiconductor device according to this embodiment includes: a first electrode; a second electrode; a semiconductor layer at least a portion of which is provided between the first electrode and the second electrode; a first-conductivity-type first semiconductor region provided in the semiconductor layer, and in contact with the first electrode; a second-conductivity-type second semiconductor region provided between the first electrode and the first semiconductor region in the semiconductor layer and in contact with the first electrode, and which satisfies the following equation when the depth from first contact plane between the first electrode and the first semiconductor region and the closest location of the second semiconductor region and the second electrode is depth (d1 (μm)), and a first-conductivity-type impurity concentration of the first semiconductor region is set as D (cm$^{-3}$); a second-conductivity-type third semiconductor region is provided between the first electrode and the second semiconductor region in the semiconductor layer and is in contact with the first electrode, and has a second-conductivity-type impurity concentration higher than a second-conductivity-type impurity concentration of the second semiconductor region; and a second-conductivity-type fourth semiconductor region that is provided between the first electrode and the first semiconductor region in the semiconductor layer, is in contact with the first electrode, has a width narrower than a width of the second semiconductor region, and has a second-conductivity-type impurity concentration lower than a second-conductivity-type impurity concentration of the third semiconductor region, and the depth d1 and concentration D meet the criteria of:

$$d1 \geq -5E{-}34D^2 + 1E{-}16D + 0.074 \quad \text{(Equation)}$$

The semiconductor device according to this embodiment is different from the first embodiment in that the depth of the second semiconductor region and the depth of the fourth semiconductor region are approximately the same as each other. Hereinafter, description of contents redundant to those in the first embodiment will be omitted.

Figure 10:
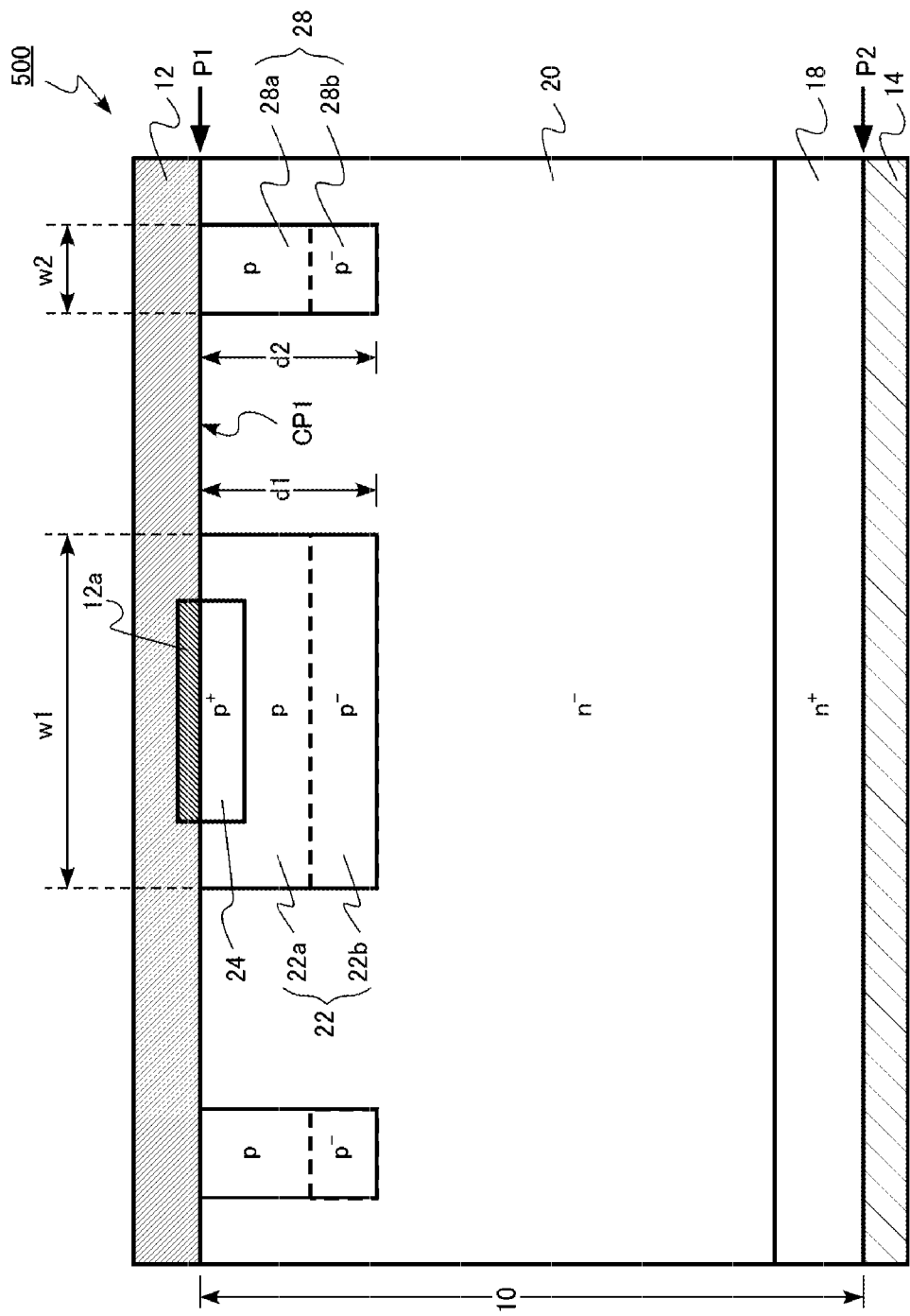
FIG. 10 is an enlarged partial cross-sectional view of a semiconductor device according to a fifth embodiment.

FIG. 10 is a partially enlarged cross-sectional view of the semiconductor device according to this embodiment.

In an MPS 500, when a depth ("d1" in FIG. 10) of the p-type first anode region 22 from the first contact plane ("CP1" in FIG. 10) is d1 (μm), and the impurity concentration of the n-type impurity in the n$^-$-type drift region 20 is D (cm$^{-3}$), the following equation is satisfied.

$$d1 \geq -5E{-}34D^2 + 1E{-}16D + 0.074 \quad \text{(Equation)}$$

The p-type region 28 includes a first region 28a and a second region 28b. The second region 28b is provided between the first region 28a and the drift region 20.

An impurity concentration of a p-type impurity in the second region 28b is lower than an impurity concentration of a p-type impurity in the first region 28a. For example, the impurity concentration of the p-type impurity in the first region 28a is from 5×10$^{16}$ cm$^{-3}$ to 5×10$^{18}$ cm$^{-3}$. For example, the impurity concentration of the p-type impurity in the second region 28b is from 1×10$^{16}$ cm$^{-3}$ to 1×10$^{17}$ cm$^{-3}$.

In addition, the depth d1 of the p-type first anode region 22 from the first contact plane CP1 and the depth ("d2" in FIG. 10) of the p-type region 28 from the first contact plane CP1 are approximately the same. For example, the p-type region 28 is formed simultaneously with the p-type first anode region 22 in the same process step.

According to this embodiment, as is the case with the first embodiment, it is possible to achieve the MPS 500 that has high forward surge resistance and is capable of increasing the on-state current density during a typical operation.

Sixth Embodiment

A semiconductor device according to this embodiment is the same as the fifth embodiment except that the fourth semiconductor region is not provided. Accordingly, description of contents redundant to those in the fifth embodiment will be omitted.

Figure 11:
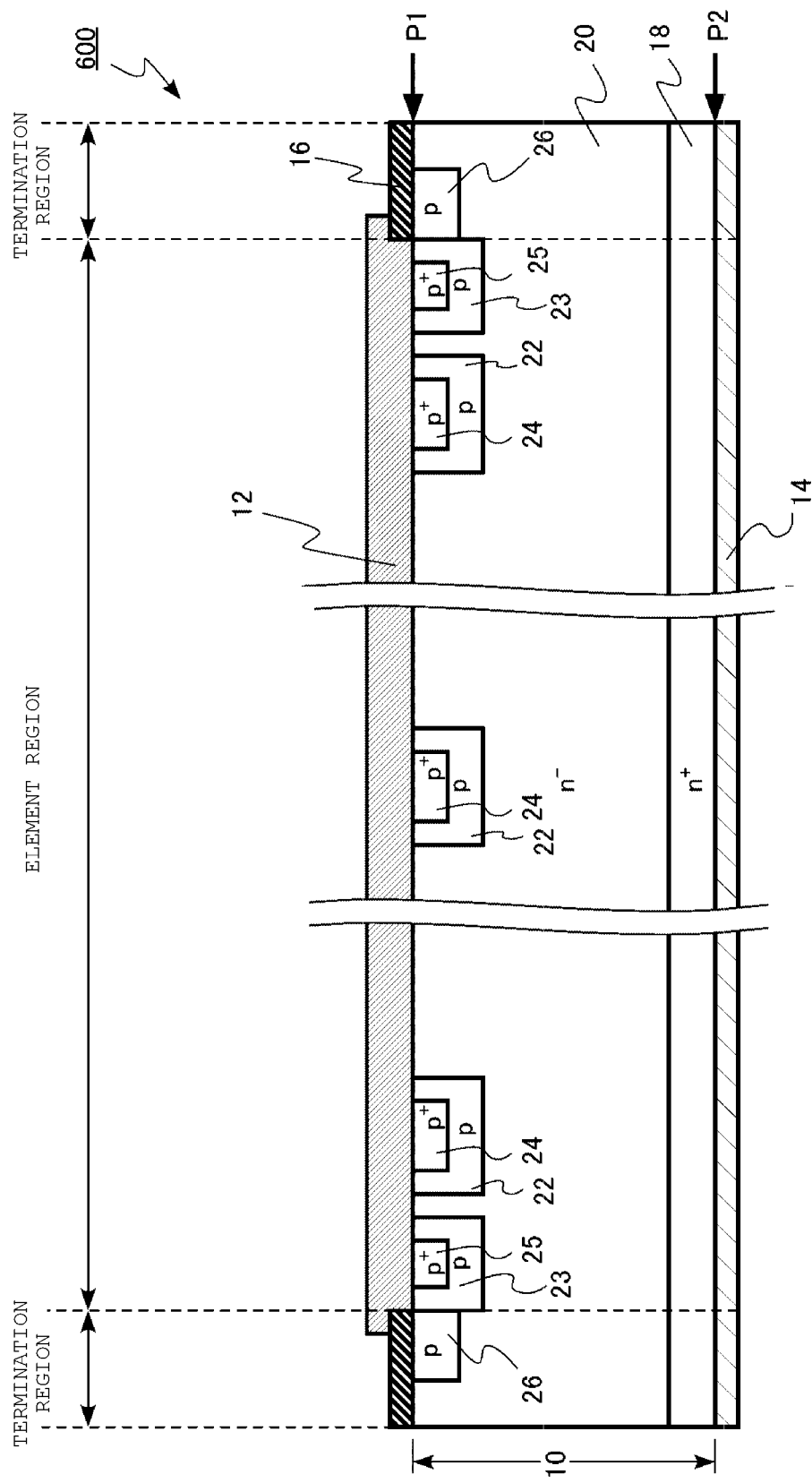
FIG. 11 is a schematic cross-sectional view of a semiconductor device according to a sixth embodiment.
Figure 12:
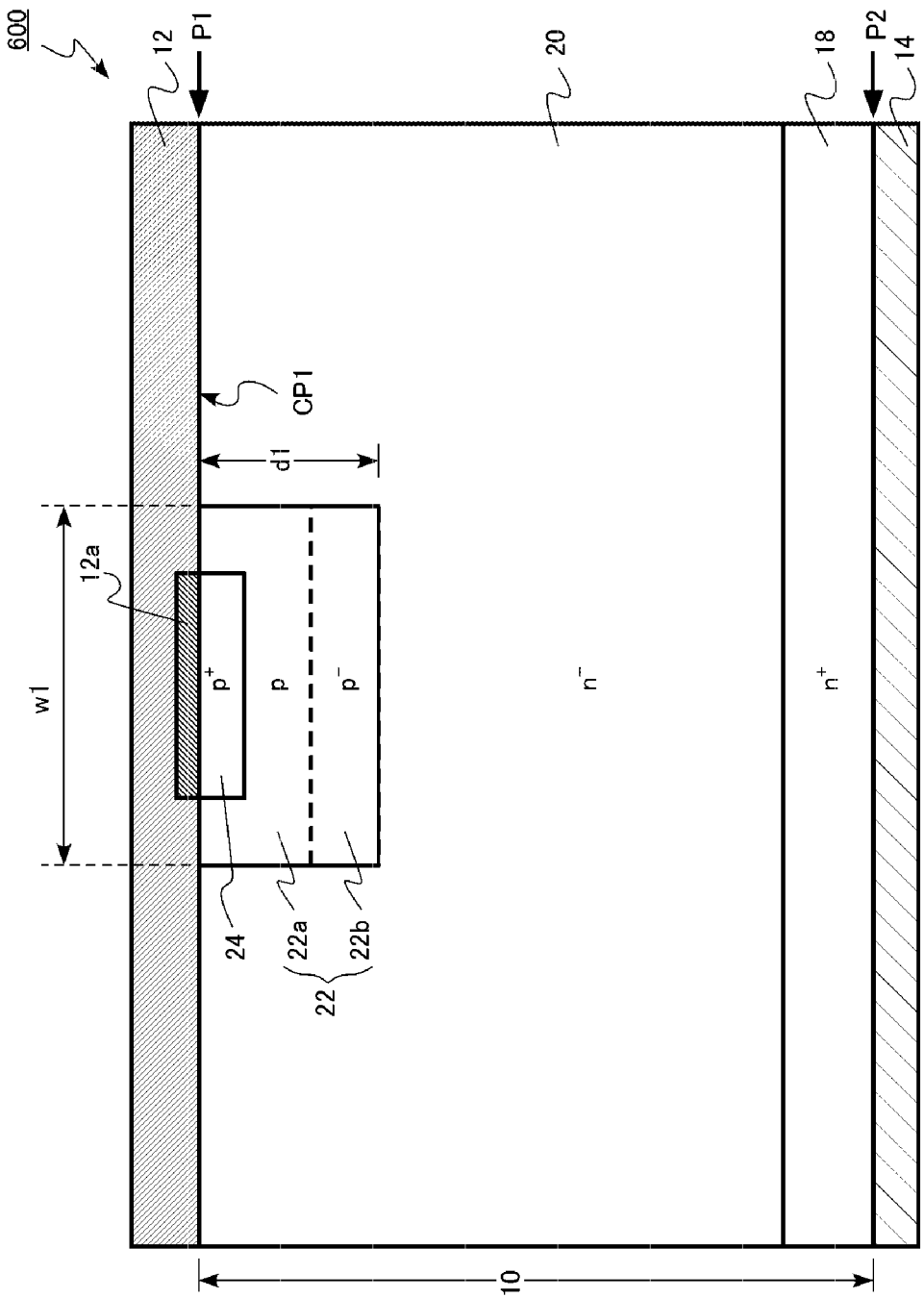
FIG. 12 is an enlarged partial cross-sectional view of a semiconductor device according to the sixth embodiment.

FIG. 11 is a schematic cross-sectional view of the semiconductor device according to this embodiment. FIG. 12 is a partially enlarged cross-sectional view of the semiconductor device according to this embodiment.

The semiconductor device according to this embodiment is an SBD. An SBD 600 according to this embodiment does not include the p-type region 28 of the MPS 500 according to the fifth embodiment.

In the SBD 600, if the depth ("d1" in FIG. 12) of the p-type first anode region 22 from the first contact plane ("CP1" in FIG. 12) is d1 (μm), and an impurity concentration of an n-type impurity in the n$^-$-type drift region 20 is D (cm$^{-3}$), the following equation is satisfied.

$$d1 \geq -5E{-}34D^2 + 1E{-}16D + 0.074 \quad \text{(Equation)}$$

According to this embodiment, it is possible to achieve the SBD 600 that has high forward surge resistance by the same operation as in the first and fifth embodiments, and is capable of increasing the on-state current density during a typical operation.

In the first to sixth embodiments, description is given of an example in which the SiC layer is the semiconductor layer, but it is also possible to apply the embodiment to a diode using, for example, a silicon (Si) layer instead of the SiC layer.

In addition, in the first to sixth embodiments, a case where 4H—SiC is used as the SiC layer is exemplified, but it is also possible to use the other crystal types such as 3C—SiC and 6H—SiC.

In addition, in the first to sixth embodiments, when the semiconductor layer is a SiC layer, description is given of a case where a plane inclined to a (0001) plane by 0° to 8° is set as the first plane, and a plane inclined to a (000-1) plane by 0° to 8° is set as the second plane as an example, but it is also possible to use a plane having a plane orientation other than the case.

In addition, in the first to sixth embodiments, nitrogen (N) is exemplified as the n-type impurity, but it is also possible to use phosphorus (P), arsenic (As), and antimony (Sb), and the like to the n-type impurity. In addition, aluminum (Al) is exemplified as the p-type impurity, but it is also possible to use boron (B).

In addition, in the first to sixth embodiments, description is given of an example in which an n-type is set as the first conductivity type and a p-type is set as the second conductivity type, but it is also possible to employ a configuration in which the first conductivity type is set as the p type and the second conductivity type is set as the n type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor diode, comprising:
   an anode electrode;
   a cathode electrode;
   a semiconductor layer, at least a portion of which is located between the anode electrode and the cathode electrode, wherein a contact location of the semiconductor layer with the anode electrode forms a first contact plane;
   a first-conductivity-type first semiconductor region located in the semiconductor layer and in contact with the anode electrode;

a second-conductivity-type second semiconductor region located between the anode electrode and the first semiconductor region in the semiconductor layer and in contact with the first electrode;

a second-conductivity-type third semiconductor region located between the anode electrode and the second semiconductor region in the semiconductor layer and in contact with the anode electrode and having a second-conductivity-type impurity concentration higher than the second-conductivity-type impurity concentration of the second semiconductor region; and a second-conductivity-type fourth semiconductor region located between the anode electrode and the first semiconductor region in the semiconductor layer and in contact with the anode electrode, the fourth semiconductor region having a width narrower than a width of the second semiconductor region and a depth inwardly of the semiconductor layer from the first contact plane shallower than a depth of the second semiconductor region inwardly of the semiconductor layer from the first contact plane, the fourth semiconductor region having a second-conductivity-type impurity concentration lower than a second-conductivity type impurity concentration of the third semiconductor region and being configured to suppress a leakage current during a reverse biasing, wherein when the depth of the second semiconductor region inwardly of the semiconductor layer from the first contact plane is $d_1$ (in µm), and the first-conductivity-type impurity concentration of the first semiconductor region is D (in $cm^{-3}$), the following relationship is satisfied: $d_1 \geq -5 \times 10^{-34} \times D^2 + 1 \times 10^{-16} \times D + 0.074$.

2. The semiconductor diode according to claim 1, wherein the second semiconductor region comprises a first portion and a second portion, the second portion is located between the first portion and the first semiconductor region, and a second-conductivity-type impurity concentration of the second portion is lower than a second conductivity-type impurity concentration of the first portion.

3. The semiconductor diode according to claim 2, wherein the second portion extends from the first contact plane on opposing sides of the first portion.

4. The semiconductor diode according to claim 1, wherein the second semiconductor region comprises a first portion and a second portion, wherein a portion of the first semiconductor region is interposed between the second portion and the first contact plane.

5. The semiconductor diode according to claim 1, further comprising:

a recess extending inwardly of the first contact plane, wherein the third semiconductor region is located between the base of the recess and the cathode electrode.

6. The semiconductor diode according to claim 1, wherein the second semiconductor region further comprises a portion thereof located at a depth further inwardly of the first semiconductor region from the first contact plane than another portion thereof.

7. The semiconductor diode according to claim 1, wherein the third semiconductor region contacts the second semiconductor region.

8. The semiconductor diode according to claim 1, wherein contact between the anode electrode and the first semiconductor region is a Schottky contact.

9. The semiconductor diode according to claim 1, wherein the semiconductor layer is a silicon carbide layer.

10. A semiconductor device, comprising:
a first electrode;
a second electrode;
a semiconductor layer, at least a portion of which is located between the first electrode and the second electrode;
a first-conductivity-type first semiconductor region located in the semiconductor layer and in contact with the first electrode;
a second-conductivity-type second semiconductor region located between the first electrode and the first semiconductor region in the semiconductor layer and in contact with the first electrode, wherein the relationship $d_1 \geq -5 \times 10^{-34} \times D^2 + 1 \times 10^{-16} \times D + 0.074$ is satisfied where a depth of the second semiconductor region extending inwardly of the semiconductor layer from the first electrode is $d_1$ (in µm), and the first-conductivity-type impurity concentration of the first semiconductor region is D (in $cm^{-3}$);
a second-conductivity-type third semiconductor region, located between the first electrode and the second semiconductor region in the semiconductor layer, in contact with the first electrode, wherein the third semiconductor region has a second-conductivity-type impurity concentration higher than the second-conductivity-type impurity concentration of the second semiconductor region; and
a second-conductivity-type fourth semiconductor region located between the first electrode and the first semiconductor region of the semiconductor layer and in contact with the first electrode, wherein the width of the fourth semiconductor region in a second direction transverse to the depth direction $d_1$ is narrower than the width of the second semiconductor region in the second direction, the fourth semiconductor region having a second-conductivity-type impurity concentration lower than the second-conductivity-type impurity concentration of the third semiconductor region.

11. The semiconductor device according to claim 10, wherein the second semiconductor region comprises a first portion and a second portion, the second portion is located between the first portion and the first semiconductor region, and the second-conductivity-type impurity concentration of the second portion is lower than the second conductivity-type impurity concentration of the first portion.

12. The semiconductor device according to claim 11, wherein the second portion contacts the first contact plane on opposing sides of the first portion.

13. The semiconductor device according to claim 10, wherein the second semiconductor region comprises a first portion and a second portion, wherein a portion of the first semiconductor region is interposed between the second portion and the first contact plane.

14. The semiconductor device according to claim 10, further comprising:

a recess extending inwardly of the first contact plane, wherein the third semiconductor region is located between the base of the recess and the second electrode.

15. The semiconductor device according to claim 10, wherein the second semiconductor region further comprises a portion thereof located at a depth further inwardly of the first contact plane than another portion thereof.

16. The semiconductor diode according to claim 1, wherein the semiconductor diode is a merged PIN-diode Schottky-diode (MPS) diode.

* * * * *